US006787974B2

(12) United States Patent
Fjield et al.

(10) Patent No.: US 6,787,974 B2
(45) Date of Patent: Sep. 7, 2004

(54) ULTRASOUND TRANSDUCER UNIT AND PLANAR ULTRASOUND LENS

(75) Inventors: Todd Fjield, Shoreham, NY (US); Edward Paul Harhen, Duxbury, MA (US); Patrick David Lopath, Setauket, NY (US)

(73) Assignee: ProRhythm, Inc., Setauket, NY (US)

( * ) Notice: Subject to any disclaimer, the term of this patent is extended or adjusted under 35 U.S.C. 154(b) by 161 days.

(21) Appl. No.: 09/988,997

(22) Filed: Nov. 21, 2001

(65) Prior Publication Data

US 2002/0030423 A1 Mar. 14, 2002

Related U.S. Application Data

(63) Continuation-in-part of application No. 09/532,614, filed on Mar. 22, 2000, now Pat. No. 6,492,762.

(60) Provisional application No. 60/252,700, filed on Nov. 22, 2000.

(51) Int. Cl.[7] ............................................ H01L 41/08

(52) U.S. Cl. ............................................ 310/335

(58) Field of Search ............................ 73/642; 310/335

(56) References Cited

U.S. PATENT DOCUMENTS

| | | | | |
|---|---|---|---|---|
| 3,433,461 A | * | 3/1969 | Scarpa | 366/112 |
| 4,207,901 A | | 6/1980 | Nigam | |
| 4,219,846 A | | 8/1980 | Auphan | |
| 4,936,303 A | | 6/1990 | Detwiler et al. | |
| 5,402,792 A | | 4/1995 | Kimura | |
| 5,795,311 A | | 8/1998 | Wess | |
| 5,817,036 A | | 10/1998 | Anthony et al. | |
| 5,821,958 A | | 10/1998 | Lim | |
| 5,873,845 A | | 2/1999 | Cline et al. | |
| 5,938,608 A | | 8/1999 | Bieger et al. | |
| 5,961,465 A | | 10/1999 | Kelly, Jr. et al. | |
| 6,383,152 B1 | * | 5/2002 | Hartmann et al. | 601/4 |

OTHER PUBLICATIONS

T. Fjield, C.E. Silcox, and K. Hynynen, "Low Profile Lenses for Ultrasound Surgery," Department of Radiology, Brigham and Women's Hospital and Harvad Medical School, Boston, MA 02115.

Todd Fjield, Christina Elise Silcox and Kullervo Hynynen, "Low–profile lenses for ultrasound surgery," IOP Publishing Ltd, Phys. Med. Biol., vol. 44, No. 7, pp 1803–1813, (Jul. 1999).

Shiu Chuen Chan, Mani Mina, Satish S. Udpa, Lalita Udpa, and William Lord, "Finite Element Analysis of Multilevel Acoustic Fresnel Lenses," IEEE Article, Transactions On Ultrasonics, Ferroelectrics, and Frequency, Control, vol. 43, No. 4, pp. 670–677, (Jul. 1996).

(List continued on next page.)

*Primary Examiner*—Mark Budd
(74) *Attorney, Agent, or Firm*—Lerner, David, Littenberg, Krumholz & Mentlik, LLP

(57) ABSTRACT

A lens for focusing an ultrasound wave having a wavelength, includes a plurality of substantially concentric rings disposed about a central point, at least one of the rings having a substantially triangular cross-section defined by first, second, and third sections, the first section extending from a proximal end radially away from the central point to a distal end, the second section extending from the distal end of, and substantially perpendicular to, the first section and terminating at a peak, and the third section smoothly sloping from the proximal end of the first section to the peak of the second section, and wherein the first, second and third sections have lengths with respect to the wavelength of the ultrasound wave such that (i) phases of the ultrasound wave are substantially additive at a focal point located on an axis perpendicular to the lens that passes through the central point, and (ii) aggregate focused ultrasound energy would not be predicted at the focal point by Snell's law refraction.

37 Claims, 14 Drawing Sheets

OTHER PUBLICATIONS

B. Hadimioglu, E.G. Rawson, R. Lujan, M. Lim, J.C. Zesch, B.T. Khuri–Yakub and C.F. Quate, "High–Efficiency Fresnel Acoustic Lenses," IEEE Article, Ultrasonics Sympossium, vol. 1, pp. 579–582, (1993).

Zhang Li and Zheng Changiu, "Calculation of Sound Insertion Loss of a Barrier by Fresnel Zone Method," Chinese Journal of Acoustics, vol. 8, No. 3, pp. 227–234, (1988).

L.A.A. Warnes, "The use of antiphased zones in an acoustic Fresnel lens for a scanning sonar transmitter," Ultrasonics, pp. 184–188, (Jul. 1982).

J. Bradford Merry, "High Performance Acousto–Optic Devices: Solutions to Fresnel Field Problems," SPIE Article, vol. 340, pp. 91–95, (Jan. 1983).

Gao Jian–Bo, Zhang Fu–Cheng, Zhao Heng–Yuan, "Focusing Properties of Acoustic Fresnel Lenses," Acta Acustica, vol. 13, No. 5, (Sep. 1988).

Qian Zhang, Peter A. Lewin and Philip E. Bloomfield, "PVDF Transducers—A Performance Comparison of Single–Layer and Multilayer Structures," IEEE Transactions on Ultrasonics, Ferroelectrics, and Frequency Control, vol. 44, No. 5, pp. 1148–1156, (Sep. 1997).

Richard L. Goldberg and Stephen W. Smith, "Multilayer Piezoelectric Ceramics for Two–Dimensional Array Transducers," IEEE Transactions on Ultrasonics, Ferroelectrics, and Frequency Control, vol. 41, No. 5, pp. 761–771, (Sep. 1994).

Qian Zhang and Peter A. Lewin, "Wideband and Efficient Polymer Transducers Using Multiple Active Piezoelectric Films," IEEE Ultrasonics Symposium Proceedings, vol. 2, pp. 757–760, (Oct. 31–Nov. 3, 1993).

Geoffrey R. Lockwood, Daniel H. Turnbull, and F. Stuart Foster, "Fabrication of High Frequency Spherically Shaped Ceramic Transducers," IEEE Transactions on Ultrasonics, Ferroelectrics, and Frequency Control, vol. 41, No. 2, pp. 231–235, (Mar. 1994).

Qian Zhang, Peter A. Lewin and Philip E. Bloomfield, "Variable frequency multilayer PVDF transducer for ultrasound imaging," Proceedings of SPIE, Ultrasonic Transducer Engineering, vol. 3037, pp. 2–12, (Feb. 27–28, 1997).

* cited by examiner

ULTRASOUND TRANSDUCER UNIT AND PLANAR ULTRASOUND LENS

CROSS REFERENCE TO RELATED APPLICATIONS

This is a continuation-in-part of U.S. patent application Ser. No. 09/532,614, now U.S. Pat. No. 6,492,762 entitled ULTRASONIC TRANSDUCER, TRANSDUCER ARRAY, AND FABRICATION METHOD, filed Mar. 22, 2000, the entire disclosure of which is hereby incorporated by reference. This application claims the benefit of U.S. Provisional Patent Application No. 60/252,700, filed Nov. 22, 2000, entitled ULTRASOUND TRANSDUCER UNIT AND PLANAR ULTRASOUND LENS, the entire disclosure of which is incorporated herein in its entirety.

BACKGROUND OF THE INVENTION

The present invention relates to an ultrasound focusing lens, a disposable ultrasound assembly, and a disposable ultrasound assembly employing an ultrasound focusing lens.

There are forms of therapy that can be applied within the body of a human or other mammalian subject by applying energy to the subject. In hyperthermia, ultrasonic or radio frequency energy is applied from outside of the subject's body to heat certain body tissues. The applied energy can be focused to a small spot within the body so as to heat a particular tissue or group of tissues to a temperature sufficient to create a desired therapeutic effect. This technique can be used to selectively destroy unwanted tissue within the body. For example, tumors or other unwanted tissues can be destroyed by applying heat to the tissue and raising the temperature thereof to a level (commonly temperatures of about 60° C. to 80° C.) sufficient to kill the tissue without destroying adjacent, normal tissues. Such a process is commonly referred to as "thermal ablation." Other hyperthermia treatments include selectively heating tissues so as to selectively activate a drug or promote some other physiologic change in a selected portion of the subject's body. Additional details on the techniques employed in hyperthermia treatments for ablation are disclosed in, for example, copending, commonly assigned PCT International Publication No. WO98/52465, the entire disclosure of which is incorporated herein by reference. Other therapies use the applied energy to destroy foreign objects or deposits within the body as, for example, in ultrasonic lithotripsy.

Often, magnetic resonance imaging devices are utilized in conjunction with ultrasonic treatments so as to ensure that the proper tissues are being affected. Combined magnetic resonance and ultrasonic equipment suitable for these applications are described in greater detail in copending, commonly assigned PCT International Publication No. WO98/52465.

Existing ultrasonic energy emitting devices include piezoelectric resonance units to produce ultrasound waves. A plurality of separate ultrasound emitting sections may be disposed in an array. It has been proposed to orient the array of ultrasound emitting sections in a relatively curved shape such that a focal length of about 20 cm is obtained. Ultrasonic emitting sections of the curved variety are typically produced by forming a curved structure, and disposing the individual ultrasound emitting sections on the curved structure to produce a unit capable of emitting a focused beam. Unfortunately, this technique is relatively expensive, in part because it requires a substantial number of processing steps to produce and locate the individual ultrasound emitting sections on the curved structure.

It is desirable in ultrasound surgery to minimize the space occupied by the equipment utilized to produce ultrasound energy (e.g., the piezoelectric transducer). A curved piezoelectric transducer to obtain focused ultrasound energy may occupy excessive space in the depth direction. Thus, it has been proposed to use a relatively planar piezoelectric transducer in combination with a focusing lens that is also preferably substantially planar. One such focusing lens employs a plurality of concentric rings, where each ring has a substantially rectangular cross-section. Additional details of this lens may be found in the following documents: (i) Todd Fjield, Christina Silcox, and Kullervo Hynynen, Low-Profile Lenses For Ultrasound Surgery, IEEE Ultrasonics Ferroelectrics And Frequency Control Symposium, Sendai, Japan, October 1998; and (ii) Todd Fjield, Christina Silcox, and Kullervo Hynynen, Low-Profile Lenses For Ultrasound Surgery, Phys. Med. Biol. 44, pp. 1803–1813 (1999). The entire disclosures of these documents are hereby incorporated by reference. As opposed to utilizing refraction theory (i.e. Snell's Law), the lenses disclosed in the above documents operate to shift the phase of the ultrasound wave as it passes through the lens such that additive phase is achieved at a focal point located away from the lens. Such a lens employs a multi-step approach where each ring has a cross-section that resembles stair steps. The ultrasound wave propagates through the lens and exits from the lens at one or more perpendicular surfaces, such as the tops of the stair steps of the rings.

It would be desirable to produce a substantially planar focusing lens that may be easily and cost effectively produced, that does not occupy excessive space in the depth direction, and that may be easily received in base equipment.

SUMMARY OF THE INVENTION

In accordance with at least one aspect of the invention, a lens for focusing an ultrasound wave having a wave length includes: a plurality of substantially concentric rings disposed about a central point, at least one of the rings having a substantially triangular cross-section defined by first, second, and third sections, the first section extending from a proximal end radially away from the central point to a distal end, the second section extending from the distal end of, and substantially perpendicular to, the first section and terminating at a peak, and the third section smoothly sloping from the proximal end of the first section to the peak of the second section, and wherein the first, second and third sections have lengths with respect to the wavelength of the ultrasound wave such that (i) phases of the ultrasound wave are substantially additive at a focal point located on an axis perpendicular to the lens that passes through the central point, and (ii) aggregate focused ultrasound energy would not be predicted at the focal point by Snell's law refraction.

In accordance with one or more other aspects of the invention, a disposable ultrasound wave unit includes: an ultrasound planar member including an array of piezoelectric transducers disposed between spaced apart forward and rearward surfaces, and being operable to produce an ultrasound wave propagating from the forward surface in a direction substantially perpendicular thereto; and a lens sonically communicating with the forward surface of the ultrasound planar member for focusing the ultrasound wave, the lens including: a substantially planar base having spaced apart first and second surfaces, the second surface being directed toward the forward surface of the ultrasound planar member; and a plurality of substantially concentric rings disposed about a central point on the first surface of the base, wherein each ring has a substantially triangular cross-section defined by first, second, and third sections, the first section extending from a proximal end radially away from the central point to a distal end along the first surface of the base, the second section extending from the distal end of, and substantially perpendicular to, the first section and terminating at a peak, and the third section smoothly sloping from the proximal end of the first section to the peak of the second section, and the first, second, and third sections of each ring having respective lengths such that (i) phases of the ultrasound wave are substantially additive at a focal point located on an axis perpendicular to the lens that passes through the central point, and (ii) aggregate focused ultrasound energy would not be predicted at the focal point by Snell's law refraction.

In accordance with still other aspects of the present invention, a lens for focusing an ultrasound wave includes: a base having spaced apart first and second surfaces and a central axis extending between the first and second surfaces; and a plurality of substantially concentric rings disposed about the central axis and defining respective contours of the first and second surfaces of the base, the substantially concentric rings being sized and shaped such that, in cross-section, a plurality of concentric radially extending zones are defined from the central axis toward a periphery of the base, at least some of the rings having a substantially triangular cross-section such that a thickness of the base from the first surface to the second surface substantially smoothly increases in relation to increased radial distances from the central axis within at least a portion of a given zone, wherein the respective substantially concentric rings are sized and shaped such that (i) phases of the ultrasound wave are substantially additive at a focal point located on the central axis, and (ii) aggregate focused ultrasound energy would not be predicted at the focal point by Snell's law refraction.

Other objects, features, and advantages of the present invention will become apparent to those skilled in the art from the following description of the invention with reference to the accompanying drawings.

BRIEF DESCRIPTION OF THE DRAWINGS

For the purpose of illustrating the invention, there are shown in the drawings forms that are presently preferred, it being understood, however, that the invention is not limited to the precise arrangements and/or instrumentalities shown.

DETAILED DESCRIPTION OF THE INVENTION

Figures 1A, 1B:
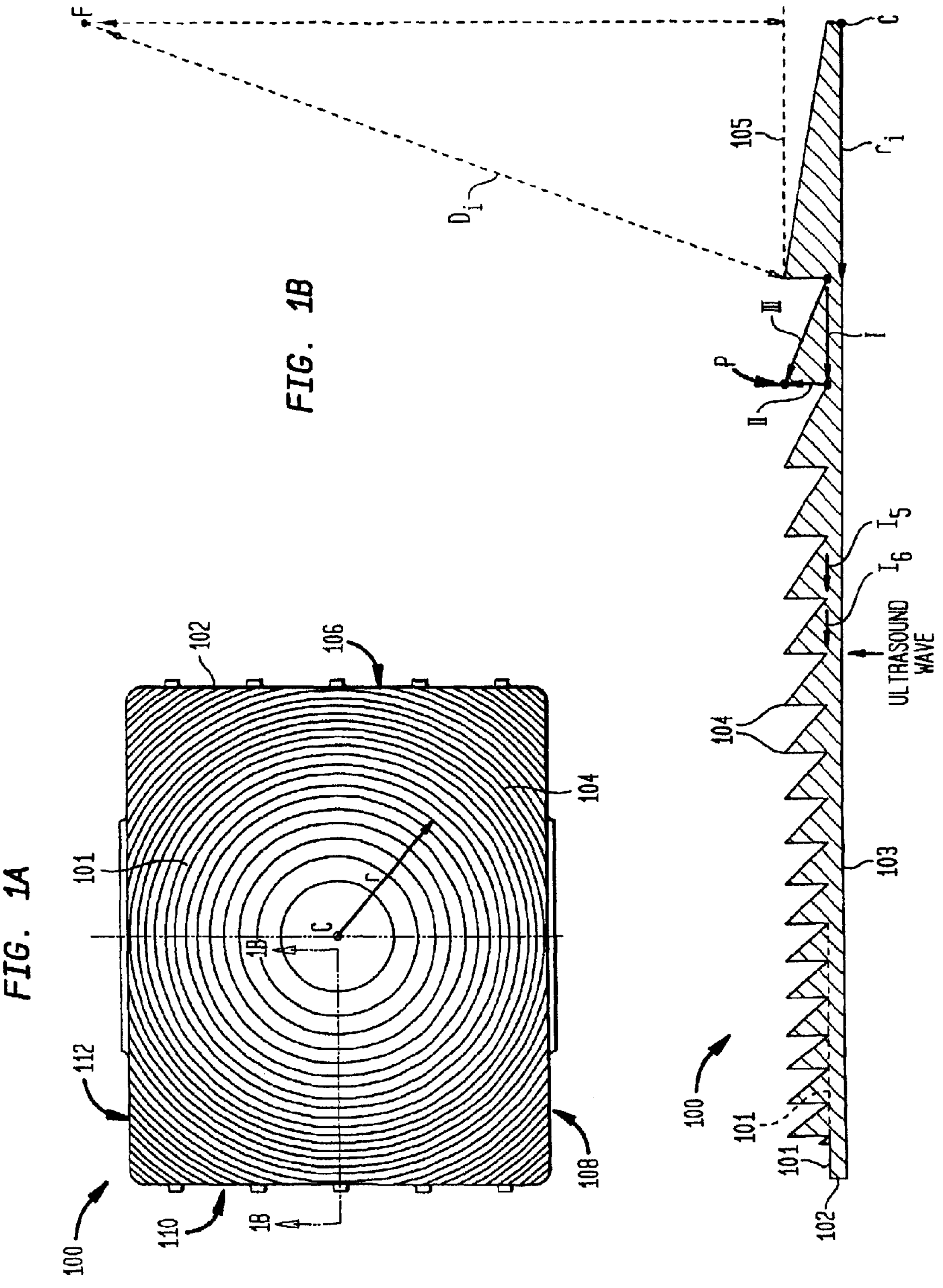
FIG. 1A is a top plan view of a focusing lens in accordance with one aspect of the present invention.
FIG. 1B is a side sectional view of FIG. 1A taken through 1B—1B (where the scale has been expanded)

Referring now to the drawings, wherein like numerals indicate like elements, there is shown in FIG. 1A, a lens 100 for focusing an ultrasound wave in accordance with one or more aspects of the present invention. The lens 100 includes a base 102, preferably of substantially planar construction, having spaced apart first and second surfaces (the first surface 101 being in the general plane of the figure and the second surface 103 being best seen in FIG. 1B). The lens 100 preferably includes a plurality of substantially concentric rings 104 disposed about a central point C, the plurality of substantially concentric rings 104 being disposed on the first surface 101. Preferably, the substantially concentric rings 104 are annularly disposed along a radius r, and terminate at peripheral edges 106, 108, 110, 112 of a rectangularly formed base 102.

Preferably, the lens 100 is formed substantially from polystyrene, crystal polystyrene being preferred. Crystal polystyrene suitable for use with the invention may be obtained from many producers, such as Goodfellow, a British corporation.

A cross-section of the lens 100 through 1B—1B is shown in FIG. 1B, the scale having been significantly expanded for purposes of discussion. As may be readily seen in FIG. 1B, the base 102 of the lens 100 includes the spaced apart first and second surfaces 101, 103, respectively, and the plurality of substantially concentric rings 104 are disposed on the first surface 101 of the base 102. It is noted that the base 102 is desirable for structural support, but is not required to practice the invention. Indeed, the plurality of substantially concentric rings 104 may be disposed directly on some other member, preferably a planar member of an ultrasound assembly. One such ultrasound assembly will be discussed in more detail hereinbelow.

The plurality of substantially concentric rings 104 are preferably sized and shaped such that phases of an incident ultrasound wave (shown by the arrow in FIG. 1B) are substantially additive at a focal point, F, located away from the base 102 along a perpendicular axis and, preferably, along an axis perpendicularly located with respect to the base 102 that passes through center point C. Surprisingly, when the substantially concentric rings 104 are sized and shaped in accordance with the invention, aggregate focused ultrasound energy would not be predicted at the focal point by Snell's law refraction.

As shown in FIG. 1B, at least one, and preferably all, of the substantially concentric rings 104 has a generally triangular cross-section defined by first, second, and third sections, labeled I, II, and III, respectively. The first section I of each substantially triangularly cross-sectioned concentric ring 104 preferably extends from a proximal end radially away from the central point C to a distal end along the first surface 101 of the base 102. The second section II preferably extends from the distal end of, and substantially perpendicular to, the first section I and terminates at a peak P. The third section III preferably smoothly slopes from the proximal end of the first section I to the peak P of the second section II.

As one moves in a radial direction, $r_i$, from the central point C, one or both of the first and third sections I, III of respective substantially concentric rings 104 have smaller lengths and the slopes of the respective third sections III are preferably relatively larger. This is so because the lengths of the respective second sections II of the substantially concentric rings 104 are preferably substantially equal, while the lengths of the respective first sections I preferably become shorter at further radii, $r_i$.

As may be gleaned from FIG. 1B, the respective first sections I of adjacent substantially concentric rings 104 extend radially from the central point C such that the distal end of a first section I (e.g., $I_5$) of an inner one of the adjacent rings 104 terminates at the proximal end of a first section I (e.g., $I_6$) of an outer one of the adjacent rings 104. From the Pythagorean relationship, distances Di from respective peaks P of the rings 104 to the focal point F adhere to the following equation: $D_i=(r_i^2+F^2)^{1/2}$, where $r_i$ is the radial distance extending from the central point C to each of the distal ends of the first sections $I_i$ of the substantially concentric rings 104 and F is a distance from the lens 100 to the focal point as measured along an axis normal to the base 102 and passing through central point C. It is desirable to ensure that distance Di increases by one wavelength $\lambda_f$ of the ultrasound wave in a medium outside the lens 100 as the radial distance $r_i$ increases. This adheres to the following equation: $D_i=F+\lambda_f \cdot i$, where i=0, 1, 2 . . . . Setting these two questions for $D_i$ equal to one another yields an expression for radial distance, $r_i$ (and by extension, the lengths of the respective first sections I), that adheres to the following equation: $(r_i^2+F^2)^{1/2}\equiv F+\lambda_f \cdot i$, where i=1, 2, 3, . . . . It is preferred that the distance F is measured from a plane 105 defined by the peaks, P, of the substantially concentric rings 104. It is understood, however, that the distance F may be measured from any arbitrary plane above the base 102 or above the lens 100.

In accordance with at least one aspect of the invention, the selection of the radial distances $r_i$ (and corresponding first sections I) of the rings 104 will cause additive phasing of the ultrasound wave at the focal point F so long as the proper dimensions of the second sections II (i.e., the thickness profile of lens) are achieved. To that end, it is most preferred that the respective lengths of the second sections II are proportional to:

$$(1/\lambda_f)\cdot((r_1^2+F^2)^{1/2}-F)\cdot(1/\lambda_f-1/\lambda_{lens})^{-1}$$

where $\lambda_f$ is the wavelength of the ultrasound wave in a medium outside the lens, $\lambda_{lens}$ is the wavelength of the ultrasound wave in the lens, and $r_1$ is the radius, $r_i$, from the center point to the first ring 104. This equation reflects that the lens 100 should shift the phase of the ultrasound wave from zero to 2π as the thickness of the leans 100 increases from the proximal ends to the distal ends of the respective third sections III. Indeed, this ensures that the increases in the distances $D_i$ by multiples of $\lambda_f$ cause additive phasing at the focal point F. The above equation for the lengths of the respective second sections II of the rings 104 is derived as follows: With reference to FIG. 1B, in traversing a distance $D_{plane}$ from first surface 101 of the lens 100 to arbitrary plane 105 through a given ring 104, the ultrasound wave passes through a distance $d_1$ of the lens medium (e.g., plastic) and through a distance $d_2$ of a medium outside the lens 100 (e.g., water). A phase shift $\Phi_o$ of the ultrasound wave from first surface 101 to plane 105 due to the medium outside the lens 100 is given by:

$$\Phi_o=2\pi\cdot D_{plane}/\lambda_f$$

A phase shift $\Phi_L$ of the ultrasound wave from the first surface 101 to plane 105 due to the lens medium and the medium outside the lens 100 is given by:

$$\Phi_L=2\pi\cdot(d_1/\lambda_{lens}+d_2/\lambda_f),$$

where $d_1$ is the distance from first surface 101 to the surface of the lens and $d_2$ is the distance from the surface of the lens to plane 105. Thus, $d_1+d_2=D_{plane}$. Using phase shift $\Phi_o$ as a reference, the change in phase $\Phi_\Delta$ from the first surface 101 to plane 105 is given by:

$$\Phi_\Delta=\Phi_o-\Phi_L$$

$$=2\pi\cdot(D_{plane}/\lambda_f-d_1/\lambda_{lens}-d_2/\lambda_f)$$

$$=2\pi\cdot(d_1/\lambda_f+d_2/\lambda_f-d_1/\lambda_{lens}-d_2/\lambda_f)$$

$$=2\pi\cdot(d_1/\lambda_f-d_1/\lambda_{lens})$$

It is noted from the above equation that the height of plane 105 above lens 100 (i.e., $d_2$) is of no consequence. Thus, if plane 105 were at distance F from the desired focus, the phase shift required to produce the desired focus could be expressed using the Pythagorean relationship as follows:

$$\Phi_\Delta=2\pi/\lambda_f\cdot((r_1^2+F^2)^{1/2}-F)$$

Setting the above equations for $\Phi_\Delta$ equal to one another yields:

$$2\pi/\lambda_f\cdot((r_1^2+F^2)^{1/2}-F)=2\pi\cdot d_1\cdot(1/\lambda_f-1/\lambda_{lens})$$

Solving for $d_1$, the length of the second section II, yields:

$$d_1=1/\lambda_f\cdot((r_1^2+F^2)^{1/2}-F)\cdot(1/\lambda_f-1/\lambda_{lens})^{-1}$$

It is noted that the lens 100 may include the base 102 having some finite thickness (i.e., a thickness between first and second surfaces 101, 103). Preferably, this thickness is small compared to the thickness of the second sections II. Since the base 102 preferably has a substantially uniform thickness between the first and second surfaces 101, 103 and the second sections II of the respective substantially concentric rings 104 extend from the first surface 101 of the base 102, the lens 100 exhibits a substantially planar profile.

The above equations defining the respective lengths of the first and third sections I and III of each of the substantially concentric rings 104 preferably yields lengths which are less than about five wavelengths of the ultrasound wave propagating through the lens 100. Although the inventions herein are not limited to a specific theory of operation, it is believed that this advantageously results in no substantial refraction of the ultrasound wave at the respective third sections III when the ultrasound wave propagates through the lens 100. Indeed, in accordance with one aspect of the invention, the phases of the ultrasound wave are substantially additive such that substantial ultrasound energy is obtained at the focal point F while the energy level at any other point proximate to the lens 100 is at least about 100 times lower.

For ease of manufacture, it is preferred that the third section III slopes along a substantially straight trajectory from the proximal end of the first section I to the peak P of the second section II (i.e., approximating the surface to be substantially linear from the proximal end of the first section I to the peak P of the second section II). Ideally, the third section III is sloped along a curved trajectory from the proximal end of the first section I to the peak P of the second section II. In this case, the third sections III of respective substantially concentric rings 104 are curved to substantially match respective segments of the following function of the radius r:

$$(1/\lambda_f)\cdot((r_1^2+F^2)^{1/2}-F)\cdot(1/\lambda_f-1/\lambda_{lens})^{-1},$$

i.e., the equation for the thickness of the lens 100 evaluated at many radii, $r_i$ modulo $(1/\lambda_f-1/\lambda_{lens})^{-1}$.

Figure 1C:
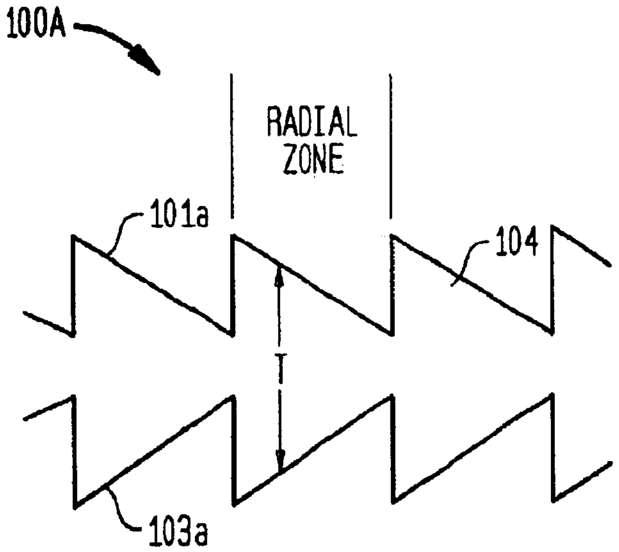
FIG. 1C is a partial cross-sectional view of a lens in accordance with another aspect of the present invention.

Reference is now made to FIG. 1C which illustrates a cross-sectional view of a lens 100A in accordance with one or more further aspects of the present invention. For clarity, FIG. 1C shows only a portion of the lens 100A. It is understood that the plurality of substantially concentric rings 104 may be disposed at and define respective contours of first and second surfaces 101*a*, 103*a* of the lens 100A such that, in cross-section, a plurality of concentric radially extending zones are defined from a central axis of the lens 100A towards a periphery of the lens 10A. Further, the rings 104 preferably have a substantially triangular cross-section such that a thickness T of the lens 100A from the first surface 101*a* to the second surface 103*a* substantially smoothly increases in relation to increased radial distances from the central axis within at least a portion of a given zone. FIG. 1C illustrates that each radially extending zone includes one ring 104 formed from each of the first and second surfaces 101*a*, 103*a* of the lens 10A. Further, the rings 104 in each radially extending zone are mirror images of one another.

Figure 1D:
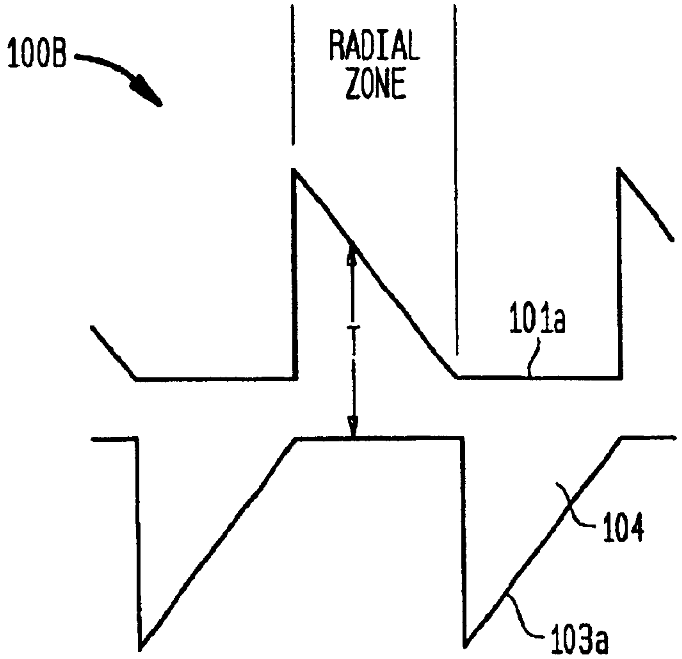
FIG. 1D is a partial cross-sectional view of a lens in accordance with yet another aspect of the present invention.

With reference to FIG. 1D, a cross-sectional view of a lens 100B in accordance with one or more further aspects of the present invention is shown. Each radially extending zone includes only one ring 104 formed from one of the first and second surfaces 101*a*, 103*a* of the lens 100B. In particular, adjacent radially extending zones include rings 104 from respective ones of the first and second surfaces 101*a*, 103*a* of the lens 100B. While FIGS. 1C and 1D illustrate two examples of how the substantially concentric rings 104 may be positioned, it is understood that many other variations will be apparent to the skilled artisan as being within the scope of the invention in light of the disclosure herein. For example, the lens 100 shown in FIG. 1B may be inverted such that the peaks P are downwardly directed (i.e., are directed toward the incident ultrasound wave shown by the arrow).

Figure 2:
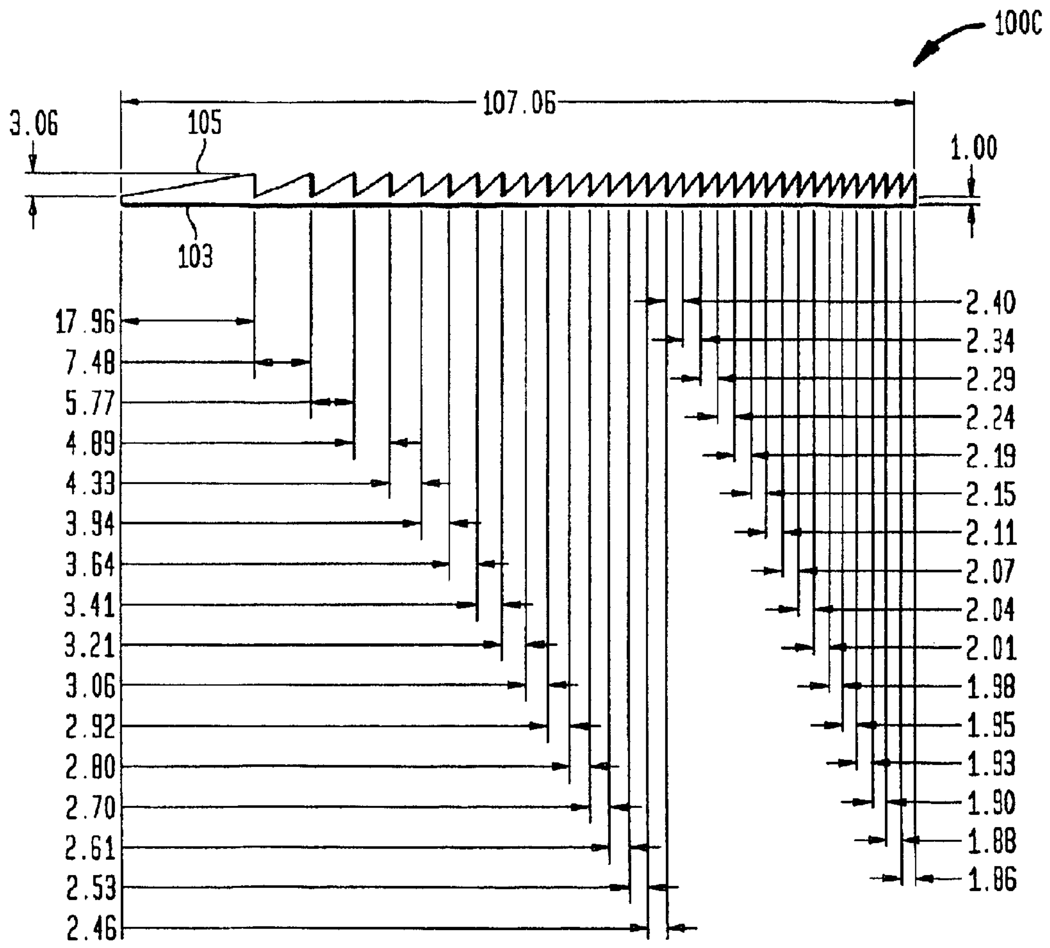
FIG. 2 is a side sectional view of a portion of FIG. 1A having preferred measurements.

Reference is now made to FIG. 2 which illustrates a cross-sectional view of a preferred lens 100C in which dimensions are shown in millimeters. This preferred lens 100 exhibits a focal point F approximately 15 centimeters away from the plane 105 when an ultrasound wave is incident at second surface 103 and propagates through the lens 100C. The lens 100C has been found to work well to focus ultrasound waves of about 1.4 MHz.

It is noted that the lenses 100, 100A, 100B, and 100C in accordance with the invention do not adhere to Snells law refraction. Indeed, it has been found that the size and shape of the rings 104 described herein would not focus the ultrasound wave toward the focal point F when Snell's law is applied. Further, while the lens 100C of FIG. 2 is on the order of 3 mm thick for a focal point 15 cm away at 1.4 MHz, a lens adhering to Snells law would be much thicker, on the order of 1 cm or more.

Figure 3:
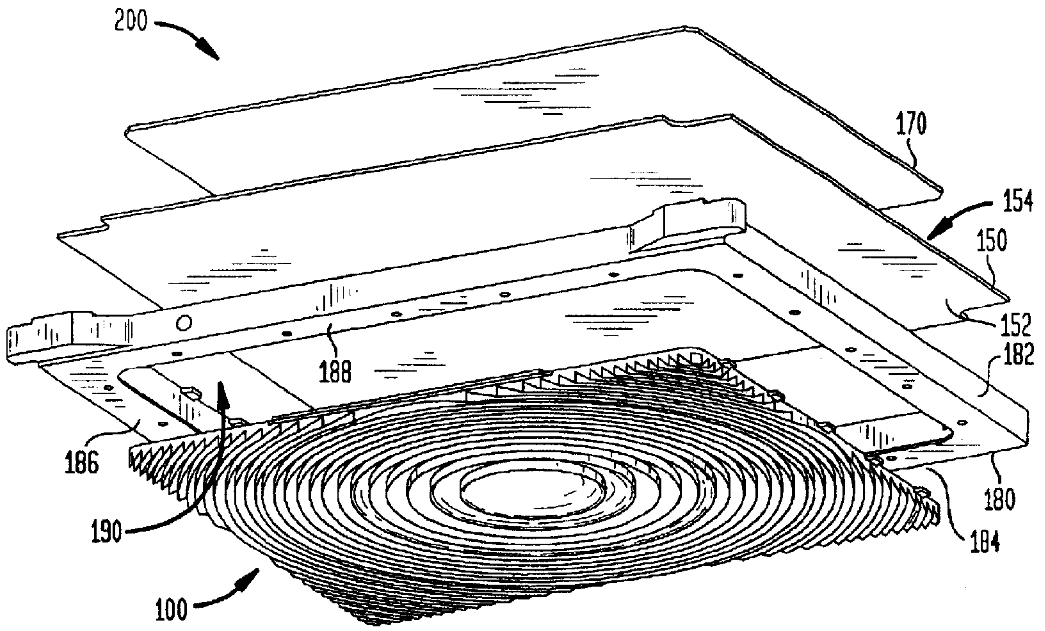
FIG. 3 is an exploded perspective view of a disposable ultrasound wave unit in accordance with one or more aspects of the present invention.

Reference is now made to FIG. 3, which is an exploded perspective view of an ultrasound wave unit 200 in accordance with one or more further aspects of the present invention. Preferably, the ultrasound wave unit 200 is disposable (or replaceable) and, thus, will be referred to as such herein. The disposable ultrasound wave unit 200 includes an ultrasound planar member 150 having an array of piezoelectric transducers (not shown) disposed between spaced apart forward and rearward surfaces 152, 154, respectively. The ultrasound planar member 150 is preferably operable to produce an ultrasound wave propagating from the forward surface 152 in a direction substantially perpendicular thereto.

The disposable ultrasound wave unit 200 preferably includes a lens 100 in sonic communication with the forward surface 152 of the ultrasound planar member 150 for focusing the ultrasound wave emanating from the ultrasound planar member 150. It is most preferred that the lens 100 is substantially similar to the lens 100 discussed above with respect to FIGS. 1A and 1B. The ultrasound planar member 150 and the lens 100 are preferably coupled to a frame 180 that is sized and shaped to achieve the desired sonic communication therebetween. In particular, the frame 180 preferably includes peripheral members 182, 184, 186, 188 defining a central aperture 190 through which the sonic communication is obtained. It is most preferred that the planar member 150 is flat and the lens 100 is flat.

It is noted that when the lens 100 does not include a base 102, the rings 104 of the lens 100 may be disposed on the ultrasound planar member 150, for example, on forward surface 152.

The disposable ultrasound wave unit 200 may also include a backing layer 170, preferably formed from alumina or silicon carbide. The backing layer 170 preferably overlies a substantial portion of the ultrasound planar member 150 such that an acoustic mismatch is achieved at the interface thereof and the ultrasound wave emanating from the ultrasound planar member 150 propagates substantially from the forward surface 152.

Figure 4A:
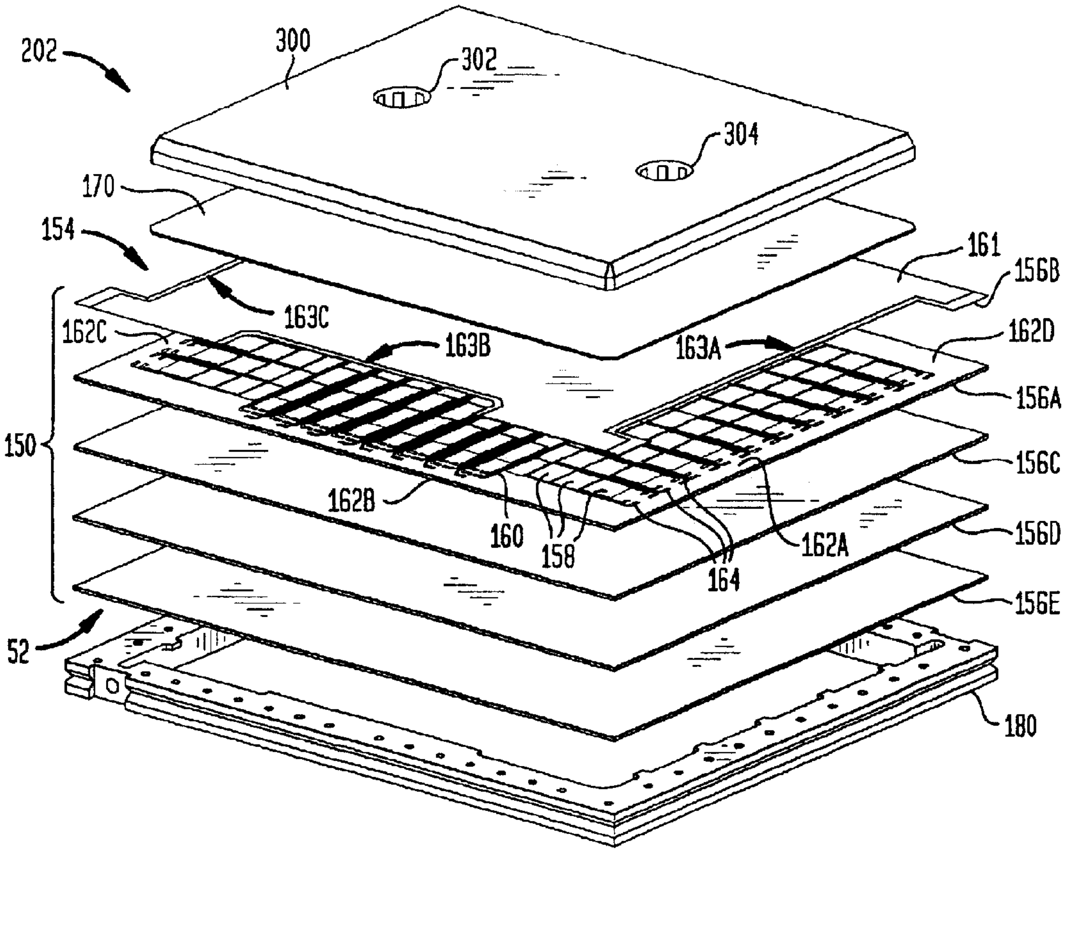
FIG. 4A is an exploded perspective view of an ultrasound wave unit in accordance with one or more other aspects of the present invention.

Reference is now made to FIG. 4A, which shows an exploded view of an ultrasound wave unit 202 in accordance with one or more further aspects of the present invention. Preferably, the ultrasound wave unit 202 is disposable and, thus, will be referred to as such hereinbelow. The disposable ultrasound wave unit 202 includes an ultrasound planar member 150, which is shown in exploded form. In particular, the ultrasound planar member 150 includes a plurality of layers 156A, 156B, 156C, 156D and 156E. Preferably, layers 156A and 156B are formed from a piezoelectric polymeric material having spaced apart forward and rearward surfaces. Suitable piezoelectric polymeric materials include polyvinylidene difluoride (PVDF), and copolymers of PVDF (such as PVDF and trifluoroethylene (TrFE)). The use of PVDF (and PVDF-TrFE, P(VDF-TrFE), in particular) as the polymeric material is most preferred.

Figure 4B:
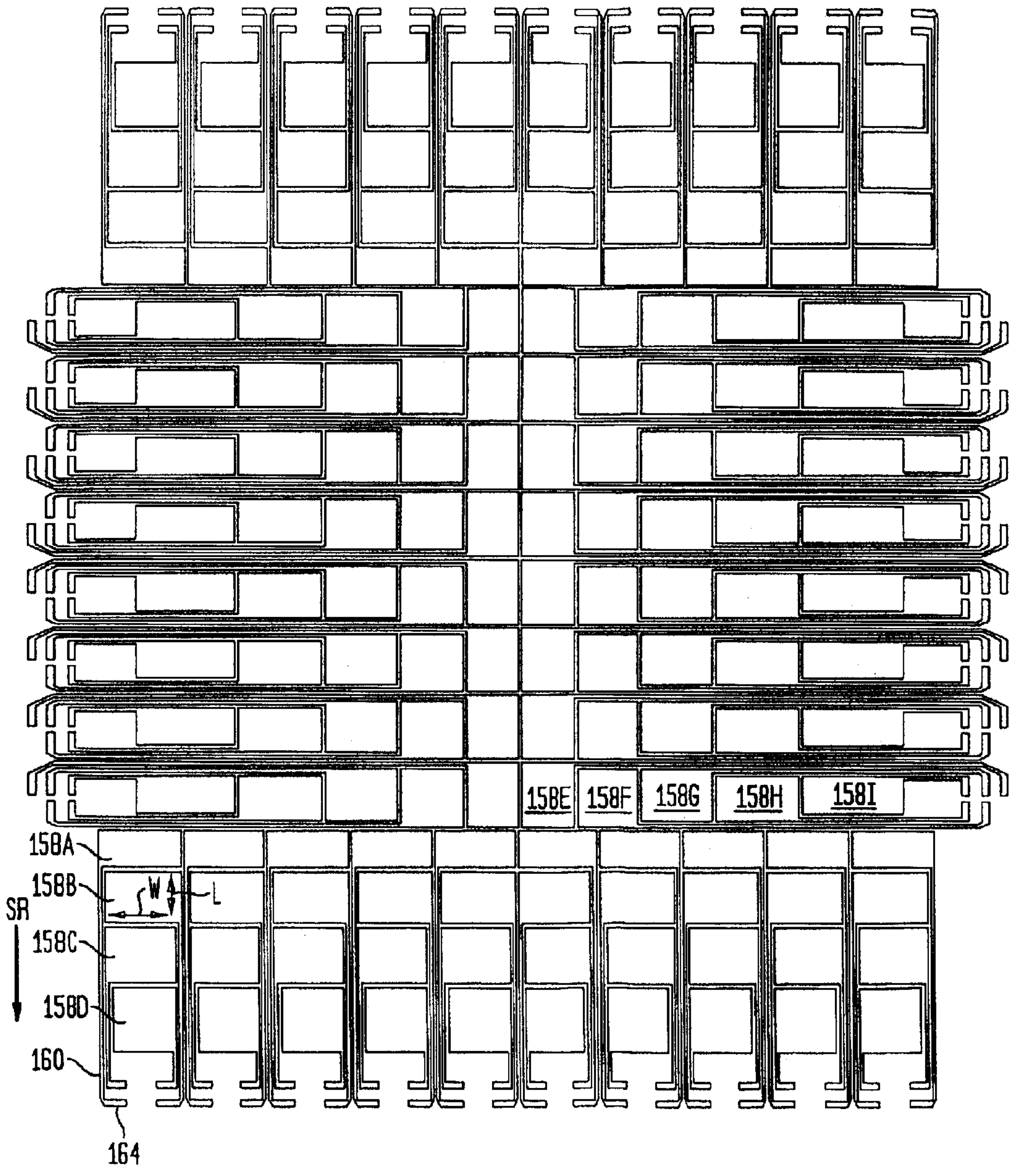
FIG. 4B is a top plan view of a signal electrode array employed in the ultrasound wave unit of FIG. 4A.

With reference to FIGS. 4A and 4B, a plurality of signal electrodes 158 are preferably disposed on the rearward surface of layer 156A (one-hundred sixty signal electrodes 158 being preferred). The signal electrodes 158 may be disposed on the polymeric material of layer 156A as, for example, by applying an electrically conductive ink on its rearward surface or by sputtering or plating. Each signal electrode 158 is preferably capable of separate excitation, which dictates separate electrical connection between respective signal electrodes 158 and an excitation source (not shown). To that end, a plurality of signal runs 160 extend from respective signal electrodes 158 to one or more peripheral edges of the polymeric material layer 156A. It is preferred that layer 156A is substantially rectangular and, therefore, includes four such peripheral edges 162A, 162B, 162C, and 162D. Distal ends of the signal runs 160 preferably terminate at terminals 164. Preferably, the terminals 164 are in the form of electrode pads that are rearwardly directed and disposed in registration with corresponding electrodes of the excitation source (not shown). As will be discussed in more detail below, when the frame 180 of the disposable ultrasound wave unit 202 is engaged with a mating apparatus, the electrodes of the excitation source electrically communicate with the terminals 164 of layer 156A such that signal voltages may be delivered to the respective signal electrodes 158.

With particular reference to FIG. 4B and in accordance with one or more further aspects of the present invention, a substantially high ratio of signal electrode area to unused area ("fill factor") is achieved. It is most preferred that higher fill factor is achieved in a central portion of the array than at a periphery of the array. It is preferred that all signal electrodes 158 in the array occupy substantially the same amount of area. These features are preferably achieved while still maintaining room to route the signal runs 160 from the respective signal electrodes 158 to the peripheral edges 162A–D. To this end, it is also preferred that respective subsets of signal electrodes 158 of the array are oriented in a direction defined by the respective signal runs 160 of those signal electrodes 158. For example, signal electrodes 158A–D may form a subset of signal electrodes 158 oriented in a signal run direction shown by arrow SR. Although the signal run direction SR is shown as generally extending from respective signal electrodes 158A–D towards the distal ends of signal runs 160 (i.e., towards the terminals 164 for that subset), it is understood that the signal run direction may be defined in the opposite sense, i.e., in a direction from the terminals 164 towards the signal electrodes 158A–D. In any event, each signal electrode 158A–D has an area defined by a length L in the signal run direction and a width W in a direction transverse to the signal run direction. While the area of a given signal electrode 158 is proportional to the product of the length L and width W, an aspect ratio for the given signal electrode 158 may be defined by the quotient of the length L to the width W. It is noted that the aspect ratio may alternatively be defined as a quotient of the width W to the length L.

Irrespective of how the signal run direction and aspect ratio of the signal electrodes 158A–D are defined, it is preferred that the aspect ratio varies from one signal electrode 158 to another in the signal run direction. For example, assuming that the signal run direction SR is as shown in FIG. 4B and the aspect ratio of a given signal electrode 158 is defined as the quotient of the length L to the width W, it is preferred that the aspect ratio increases from one signal electrode 158 to another signal electrode 158 in the signal run direction SR. More particularly, it may be seen from FIG. 4B that signal electrode 158A has an aspect ratio that is less than unity. The aspect ratios, however, of signal electrodes 158B, 158C, and 158D increase, where the aspect ratio of signal electrode 158D may be substantially equal to or greater than unity. It is noted that the aspect ratio of a given signal electrode 158 that is furthest from the terminals 164 of the subset need not have an aspect ratio that is less than unity. Indeed, another subset of signal electrodes 158 of the array, namely, signal electrodes 158E–I have respective aspect ratios starting from approximately unity (e.g., signal electrode 158E) and ending at an aspect ratio which is substantially greater than unity (e.g., signal electrode 158I). It is noted that when the aspect ratio is defined as the quotient of the width W to the length L, the aspect ratios of respective signal electrodes 158 in a subset decrease from one signal electrode 158 to another signal electrode 158 in the signal run direction SR (given that this direction extends toward the terminals 164).

Advantageously, the relationship between subsequent aspect ratios of the signal electrodes 158 within a subset and the signal run direction SR permits room for the signal runs 160 to extend from the respective signal electrodes 158 to the terminals 164 at the periphery of layer 156A. Additional advantages are also achieved, namely, that vias are avoided and, therefore, reduced cost in manufacturing is achieved. As shown in FIG. 4B, this additional room is utilized by routing a signal run 160 of one signal electrode (e.g., signal electrode 158A) along one side of the subset of signal electrodes 158 and routing a signal run 160 of an adjacent signal electrode 158 (e.g., signal electrode 158B) along an opposite side of the subset of signal electrodes 158. The signal runs 160 of further signal electrodes 158 within the subset are likewise routed on alternating sides of the subset of signal electrodes 158. Under extreme ultrasound steering conditions, adjacent signal electrodes 158 in the signal run direction SR emit ultrasound waves that are 180° out of phase and, therefore, routing the signal runs 160 in this manner results in adjacent signal runs 160 carrying excitation signals that are substantially in phase. Advantageously, the signal runs 160 contribute to the emission of ultrasound energy, thereby increasing the effective active emitting area of the array.

Figure 4C:
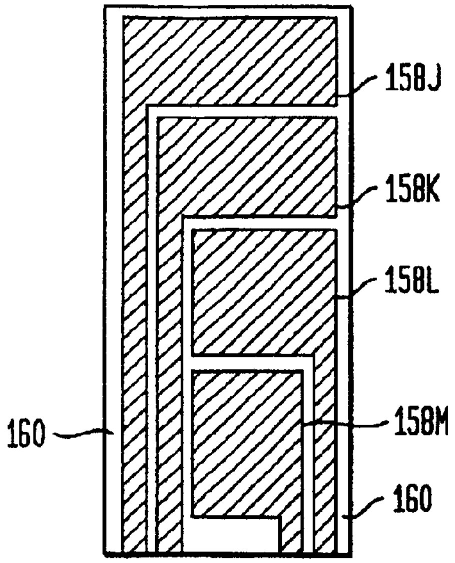
FIGS. 4C and 4D are partial top plan views of alternative signal electrode configurations suitable for use in the array of FIG. 4B.
Figure 4D:
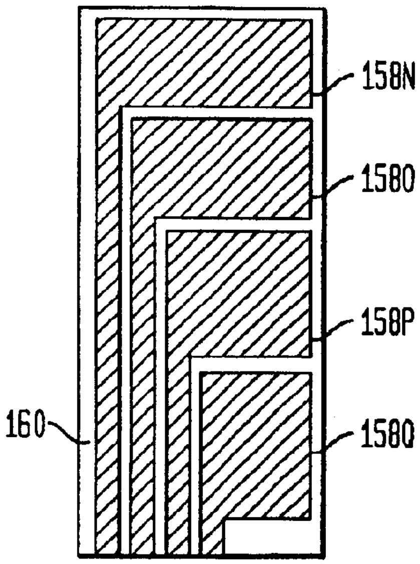

With reference to FIGS. 4C and 4D, alternative methodologies for utilizing the space to route the signal runs 160 may be employed. For example, as shown in FIG. 4C, the signal electrodes 158 of a subset are organized into adjacent groups, such as pairs. Each pair of signal electrodes 158 within the subset have their respective signal runs 160 routed along the same side of the subset. Thus, the signal runs 160 for signal electrodes 158J and 158K are routed along a first side of the subset, while another pair of signal electrodes 158L and 158M have signal electrodes 160 routed along a second side of the subset. As shown in FIG. 4D, all of the signal runs 160 of the signal electrodes 158N–Q within a subset may be routed down the same side of the subset.

The ultrasound planar member 150 preferably includes layer 156B formed from a piezoelectric polymeric material and having spaced apart forward and rearward surfaces, the rearward surface including a ground layer 161 that substantially overlies the plurality of signal electrodes 158. Layer 156B preferably includes cut-outs 163A, 163B, and 163C at respective peripheral edges thereof such that access to terminals 164 may be obtained from a rearward direction (it being noted that an additional cut-out may be included on layer 156B in correspondence with peripheral edge 162D of layer 156A, but cannot be seen in FIG. 4A).

The ultrasound planar member 150 preferably includes layer 156C having forward and rearward surfaces (the rearward surface being visible), where the rearward surface includes a ground layer (not shown) that substantially overlies the signal electrodes 158. Preferably, layers 156C, 156D and 156E are formed from mylar, polyethylene, and mylar, respectively. These layers of the ultrasound planar member 150 preferably measure 0.01 inches thick and are preferably laminated together to form a unit having the spaced apart forward and rearward surfaces 152, 154, respectively, discussed above with respect to FIG. 3.

The ultrasound planar member 202 preferably includes a backing member 170 that may be substantially similar to the backing layer 170 of FIG. 3. The backing layer 170 preferably overlies substantially all of the signal electrodes 158, but does not interfere with the cut-outs 163A, 163B and 163C such that access to terminals 164 may be obtained at the peripheral edges 162A, 162B, 162C, and 162D of layer 156A. It is most preferred that backing layer 170 also provide thermal communication with the ultrasound planar member 150 such that heat may be drawn from the ultrasound planar member 150 into and through the backing layer 170.

The disposable ultrasound wave unit 202 preferably includes a fluid box 300 in thermal communication with the rearward surface 154 of the ultrasound planar member 150 (through the backing layer 170 when employed). The fluid box 300 includes at least one, and preferably first and second input/output fluid ports 302, 304 for entry and/or egress of cooling fluid. It is most preferred that the first and second input/output fluid ports 302, 304 are rearwardly and substantially perpendicularly directed with respect to the rearward surface 154 of the ultrasound planar member 150. The cooling fluid may be a liquid, such as water or the fluid may be a gas, such as air. Preferably, the fluid box 300 is sized and shaped to substantially overly the rearward surface 154 of the ultrasound planar member 150 without interfering with the cut-outs 163A, 163B, 163C of layer 156B or the terminals 164 at the peripheral edges 162A, 162B, 162C, and 162D of layer 156A.

Preferably, the fluid box 300 is in the form of a cap communicating with the backing layer 170 to define a volume for receiving the cooling fluid.

Figure 5A:
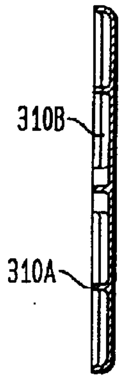
FIGS. 5, 5A, and 5B are a top plan view and sectional views, respectively, of a preferred fluid box in accordance with one or more aspects of the present invention.
Figure 5:
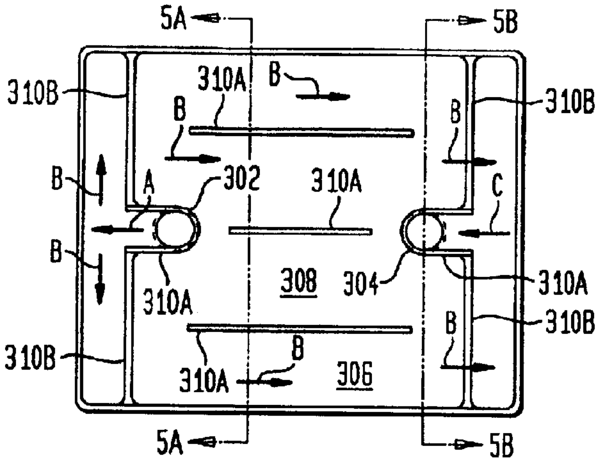
Figure 5B:
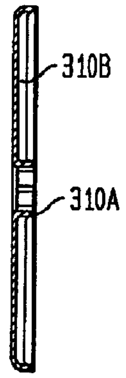

As best seen in FIG. 5 (and sectional views FIG. 5A and FIG. 5B), the first and second input/output fluid ports 302, 304 of the fluid box 300 communicate with interior volume 306. The cap shape of the fluid box 300 preferably includes a substantially planar inner surface 308 which is spaced away from the rearward surface 154 of the ultrasound planar member 150 (or the backing layer 170 when employed). The fluid box 300 preferably also includes at least one transversely directed fin 310 extending from the inner surface 308 and at least towards the rearward surface 154 (or backing layer 170) to channel the cooling fluid thereover. It is most preferred that the fluid box 300 includes a plurality of transversely directed fins 310 extending from the inner surface 308, where some of the fins substantially reach the backing layer 170 (when employed), such as fins 310A. Preferably others of the fins 310 terminate substantially away from the backing layer 170 (when employed) such that the cooling fluid may flow under the fins 310 but is substantially directed to thermally engage the backing member 170. For example, fins 310B preferably terminate substantially away from the backing layer 170.

Assuming that the first port 302 is an input port, the transversely directed fins 310 are preferably oriented such that cooling fluid: (i) enters the volume 306 through the first input/output fluid port 302; (ii) is directed away from the second input/output fluid port 304 in the direction of arrow A; (iii) is directed over the backing layer 170 past the second input/output fluid port 304 as shown by arrows B; and (iv) is directed toward and out of the second input/output fluid port 304 as shown by arrow C.

It is most preferred that the cooling fluid be urged into the first port 203 and out of the second port 304 using suction (as opposed to positive pressure) so that a leak in the system will not permit cooling fluid (e.g. water) to contact components of the disposable ultrasound wave unit 202.

Figure 6:
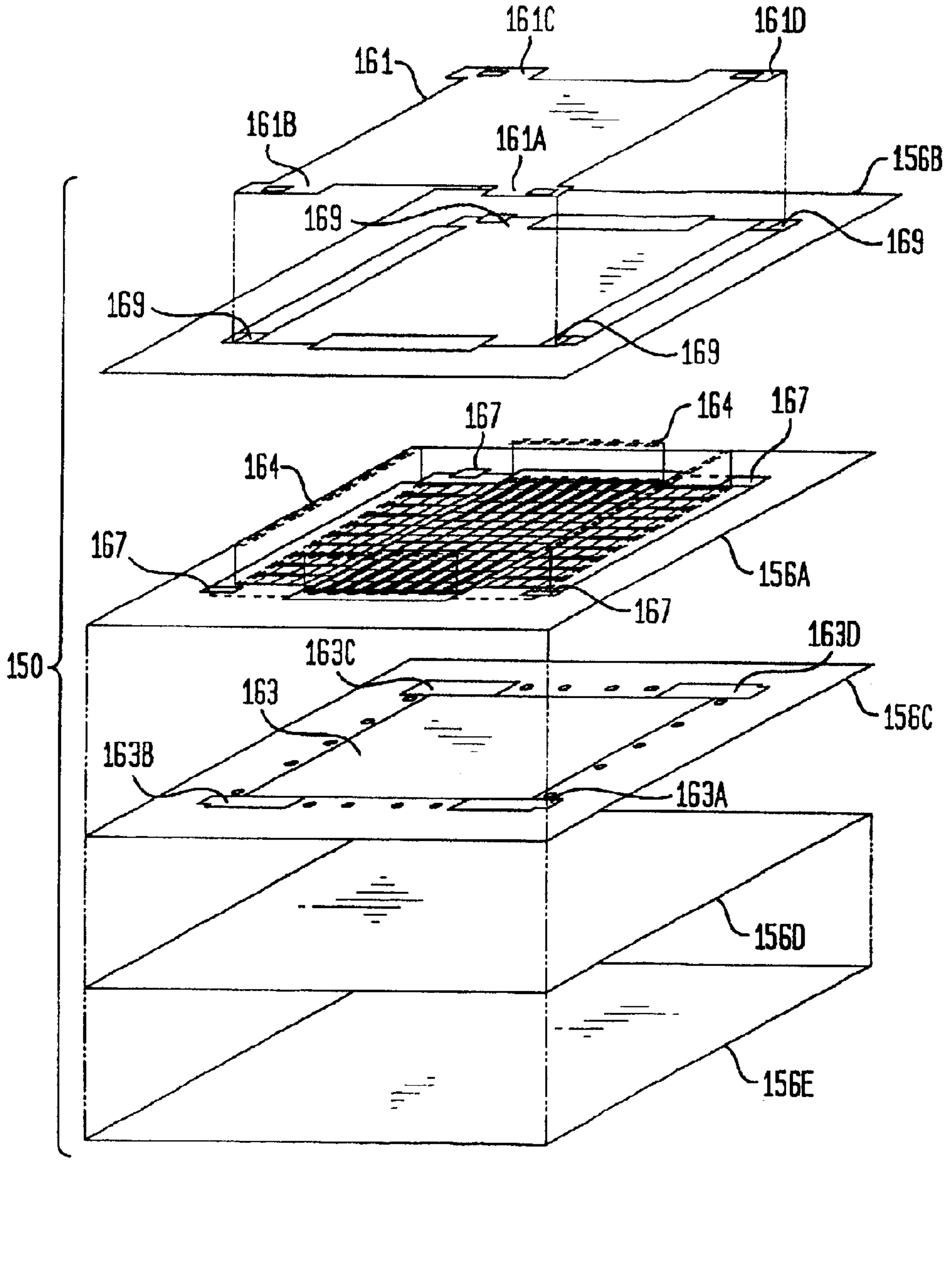
FIG. 6 is an exploded perspective view of a preferred ultrasound planar unit in accordance with one or more aspects of the present invention.

Turning again to a preferred construction of the ultrasound planar member 150 and as best seen in FIG. 6, layer 156C includes a ground layer 163 disposed on a rearward surface thereof, where the ground layer 163 includes connecting terminals 163A, 163B, 163C, and 163D at respective corners thereof. Similarly, ground layer 161 of layer 156B includes connecting terminals 161A, 161B, 161C, and 161D at respective corners thereof. As it is desirable to obtain electrical communication with ground layer 163 of layer 156C, connection terminals 163A–D are rearwardly directed. To achieve electrical communication with the connection electrodes 161A–D of layer 156C, apertures 167 are disposed in layer 156A and are in registration with the connection terminals 163A–D of layer 156C. In addition, apertures 169 are disposed in layer 156B and are in registration with apertures 167 of layer 156A such that rearward access to the connection terminals 163A–D of layer 156C is obtained.

Figure 7:
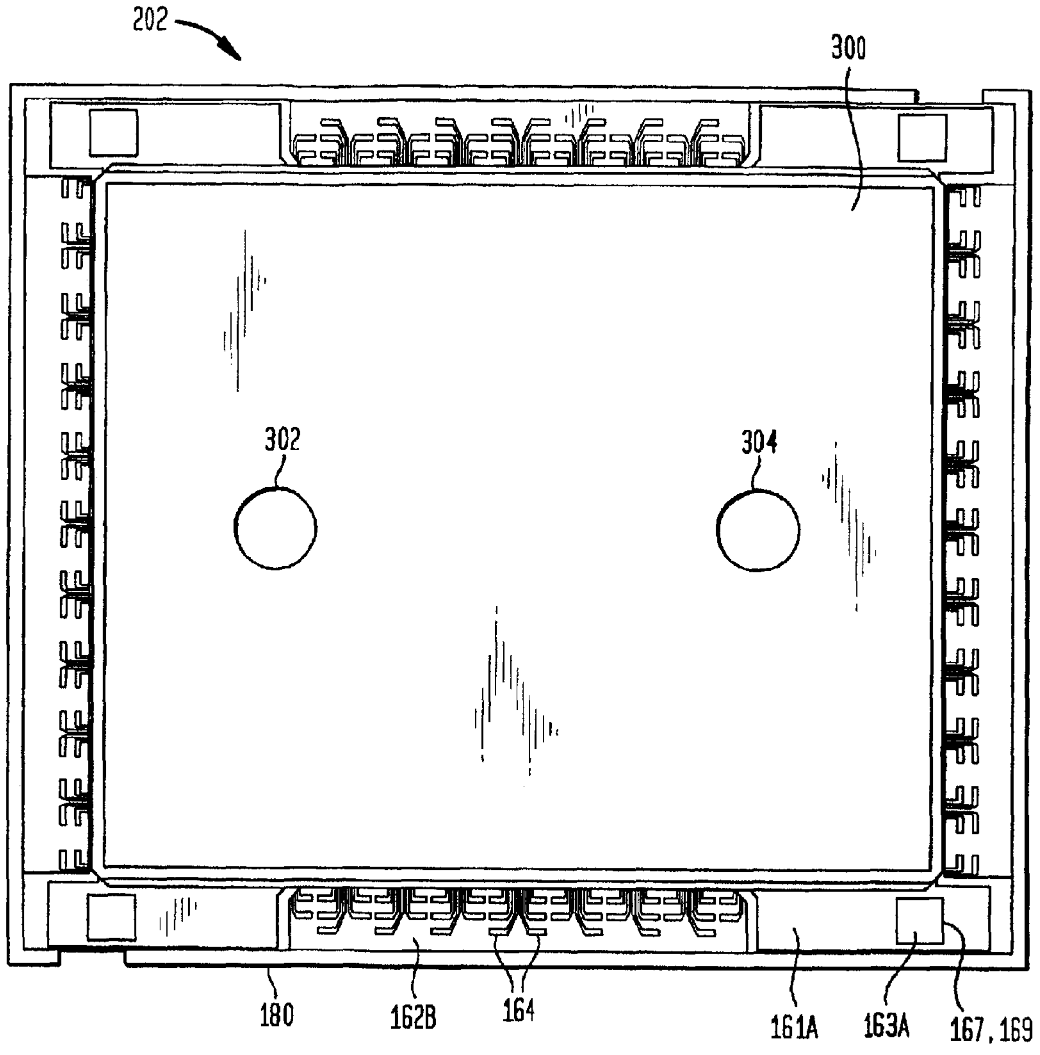
FIG. 7 is a top plan view of a disposable ultrasound wave unit in accordance with one or more aspects of the present invention.

As best seen in FIG. 7, when the ultrasound planar member 150, frame 180, and fluid box 300 are assembled, a top plan view of the disposable ultrasound wave unit 202 reveals that the terminals 164 of layer 156A, the connection terminals 163A–D of layer 156C, and the connection terminals 161A–D of layer 156B are electrically accessible from a rearward direction. In addition, access to the first and second input/output fluid ports 302, 304 are accessible from the rearward direction.

Figure 8:
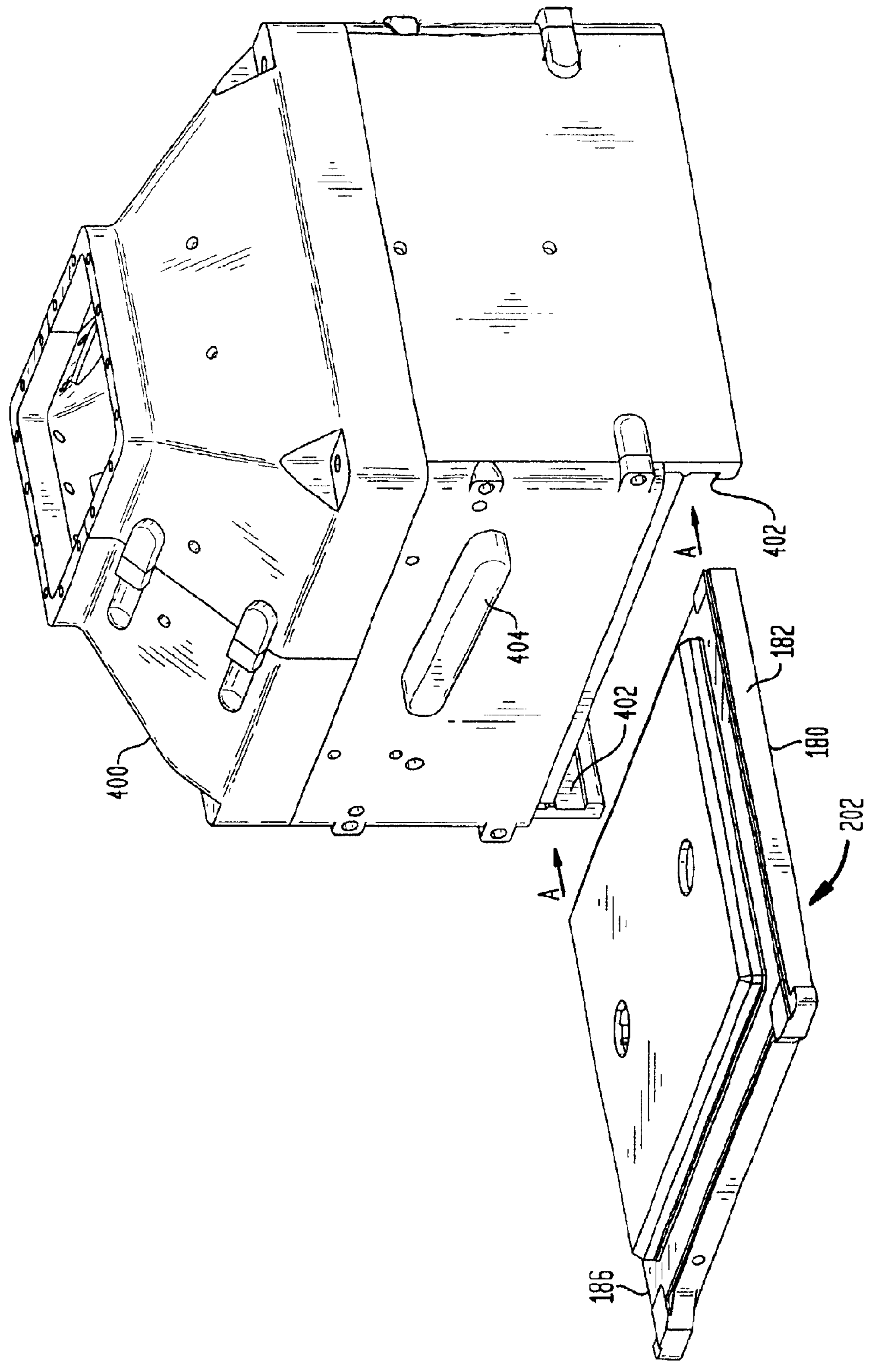
FIG. 8 is a perspective view of an apparatus for receiving a disposable ultrasound wave unit in accordance with one or more aspects of the present invention.

In accordance with another aspect of the present invention and with reference to FIG. 8, the disposable ultrasound wave unit 202 is preferably operable to be releasably received into a control head 400, which is part of a larger apparatus (not shown). The control head 400 includes lateral channels 402 sized and shaped to slidably engage respective peripheral members 182, 186 of frame 180. In use, the disposable ultrasound wave unit 202 is fully inserted into the control head 400 and lever 404 is rotated to electrically communicate with, and mechanically engage, the disposable ultrasound wave unit 202.

Figure 9:
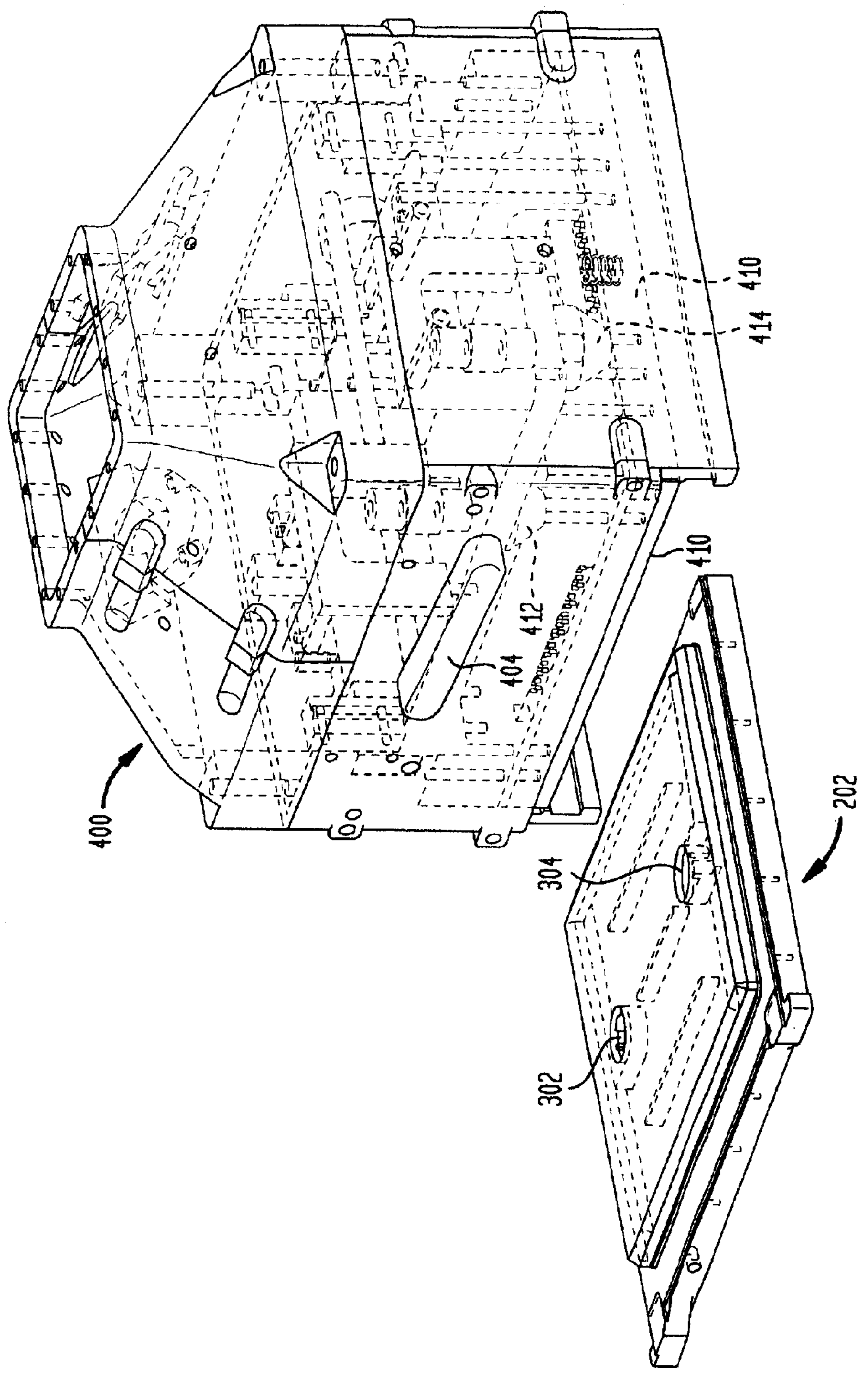
FIG. 9 is a more detailed perspective view of FIG. 8.

As best seen in FIG. 9, control head 400 includes numerous elements for communicating with the disposable ultrasound wave unit 202. In particular, the control head 400 includes a plurality of connector elements 410, preferably of the conventional pogo-pin variety, which are downwardly directed. Preferably, the connector elements 410 are in registration with rearwardly directed terminals 164, rearwardly directed connector terminals 161A–D, and rearwardly directed connecter terminals 163A–D of the disposable ultrasound wave unit 202 (see FIG. 7).

The control head 400 also includes at least one, and preferably first and second cooling fluid nipples 412, 414, which are downwardly directed and preferably in registration with first and second input/output fluid ports 302, 304 of the disposable ultrasound wave unit 202. It is most preferred that connector elements 410 and fluid nipples 412, 414 are substantially simultaneously movable toward and away from the disposable ultrasound wave unit 202 by virtue of rotatable lever 404 using any of the known techniques, for example, by way of mechanical shafts, cams, plates, etc. Thus, when the disposable ultrasound wave unit 202 is inserted into the control head 400 and the rotatable lever 404 is activated, the connector elements 410 and the nipples 412, 414 may substantially simultaneously engage the terminals 164, connector terminals 161A–D, connector terminals 163A–D and ports 302, 304, respectively, of the disposable ultrasound wave unit 202.

Figure 10:
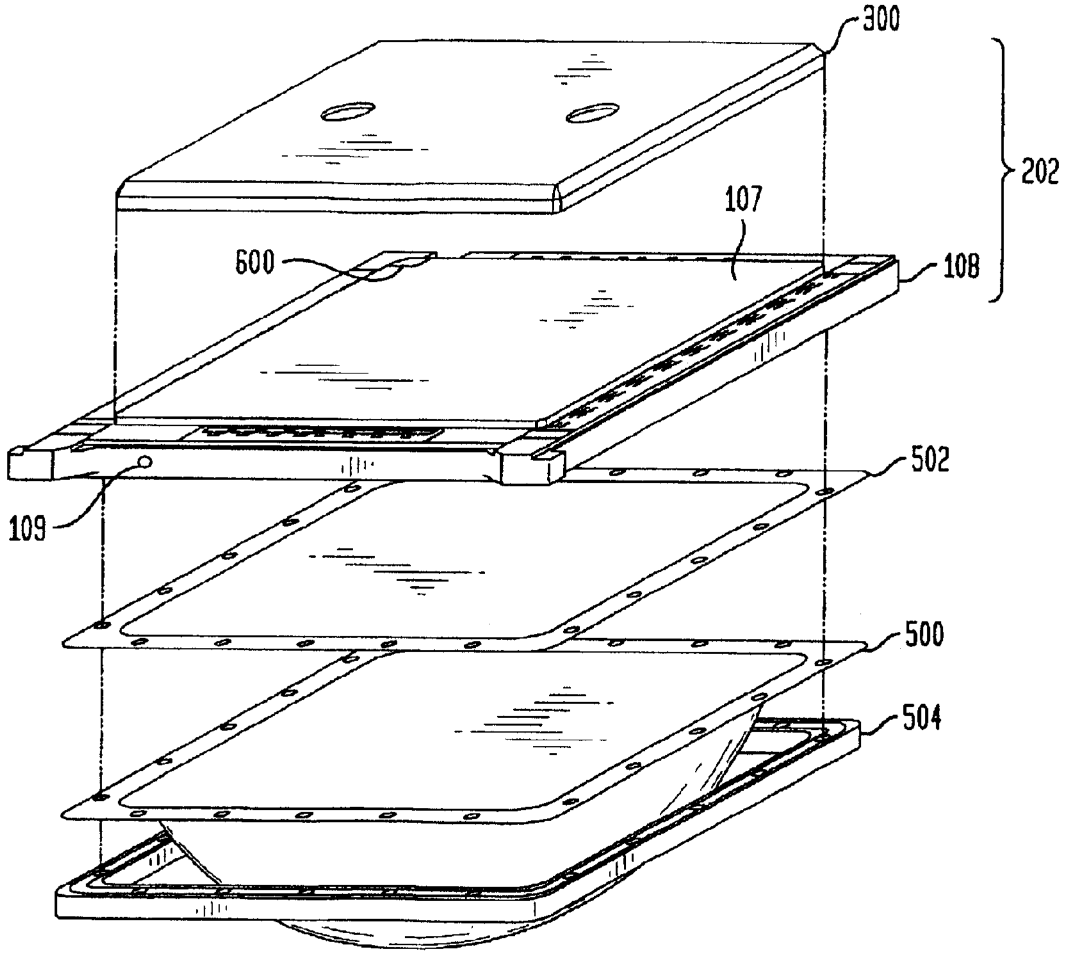
FIG. 10 is an exploded perspective view of a disposable ultrasound wave unit in accordance with further aspects of the present invention.

Reference is now made to FIG. 10, which is a partially exploded perspective view of the disposable ultrasound wave unit 202. Preferably, the disposable ultrasound unit 202 includes a lens 100 (not seen in FIG. 10) that is substantially similar to the lens 100 discussed hereinabove with respect to FIGS. 1A–B. The disposable ultrasound wave unit 202 also preferably includes a substantially flexible bag 500 in sonic communication with the forward surface of the ultrasound planar member 150 (by way of the lens). Preferably, the flexible bag 500 defines an inner volume containing de-gased water. The flexible bag 500 may also contain a cavitation suppressant, such as vitamin C. The de-gased water (and cavitation suppressant) may be inserted into the flexible bag 500 by way of port 109, which may then be sealed. The flexible bag 500 is preferably coupled to the frame 108 via frame 504 and gasket 502.

Figure 11:
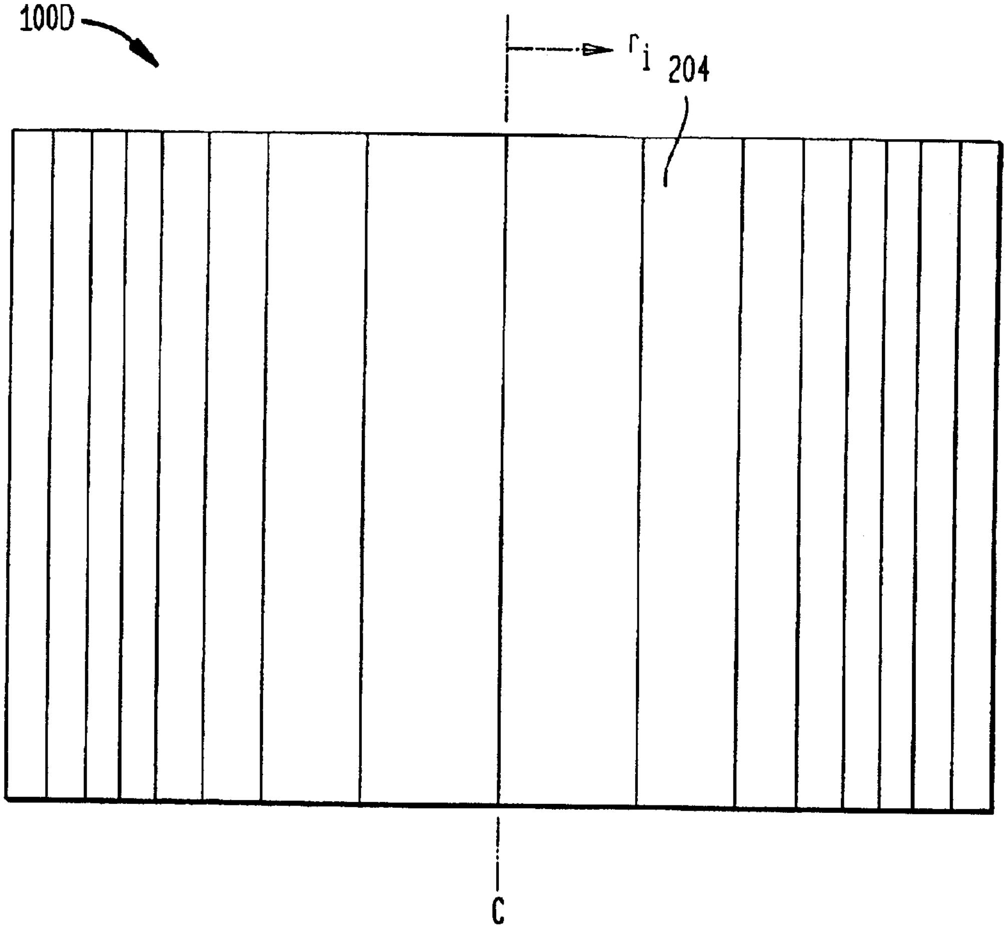
FIG. 11 is a top plan view of a focusing lens in accordance with at least one further aspect of the present invention.

Reference is now made to FIG. 11, which is a top plan view of a focusing lens 100D in accordance with at least one further aspect of the present invention. The lens 100D includes a plurality of elongated fins 204 oriented in a parallel relationship to a central axis C. Each fin 204 has a cross-section as illustrated in FIG. 1B, where distances $r_i$ relate to the widths of the fins 204 rather than the radii of the rings 104 (FIG. 1). Thus, instead of concentric rings 104 extending annularly around central point C, fins 204 extend linearly in parallel relationship to central axis C. The thickness profile of the fins 204 preferably adhere to the following equation:

$$1/\lambda_f((r_i^2+F^2)^{1/2}-F)\cdot(1/\lambda_f-1/\lambda_{lens})^{-1},$$

i.e., the same equation for the thickness of the lens 100 of FIG. 1B, evaluated at many distances $r_i$ modulo $(1/\lambda_f-1/\lambda_{lens})^{-1}$. The lens 100D focuses a planar ultrasound wave along a line parallel to central axis C and spaced away from the lens 100D at a distance F.

The disposable ultrasound wave unit 202 also preferably includes at least one memory device 600 that stores data defining the properties of the piezoelectric transducers of the ultrasound planar member 150. The memory device 600 may be a nonvolatile digital memory such as a ROM, PROM or EEPROM, or an array of resistors or other components having resistance values or other parameter values which encode information representing the parameters to be stored by the memory device 600. A machine-readable label, magnetic strip, RF-readable tag or optical device may also be employed as the memory device 600, provided that the control head 400 incorporates an appropriate reading device. Where the memory device 600 is an electrical device, the memory device 600 may be electrically connected to the control head 400 by way of connector elements 410.

When the disposable ultrasound wave unit 202 is engaged with the control head 400, data from the memory device 600 is transferred to a control computer (not shown) associated with the control head 400. The memory device 600 may be destroyed or erased upon data transfer, so that the disposable ultrasound wave unit 202 cannot be reused. Alternatively, the data stored in the memory device 600 may be altered, as by writing information indicating that the disposable ultrasound wave unit 202 has been used into the memory device 600 or incrementing a usage count stored in the memory device 600. The memory device 600 may also store information useable by the control computer in operation with the disposable ultrasound wave unit 600. This information may include identification of the disposable ultrasound wave unit 202 such as a model number and/or serial number, and may also include parameters such as the maximum drive signal power or maximum drive signal voltage to be applied to individual piezoelectric transducers of the ultrasound planar unit 150 or to the unit 150 as a whole.

The data included in the memory device 600 desirably includes one or more parameters which affect a relationship between output amplitude and/or phase and the amplitude and/or phase of the applied drive signal for each piezoelectric transducer at one or more temperatures. For example, a parameter which affects the amplitude relationship may be the conversion efficiency of the transducer; a ratio of acoustic output amplitude (or power) to electrical drive signal amplitude (or power); or an amplitude correction factor. Parameters which affect the phase relationship include the phase offset relative to the drive signal and the phase offset between transducers, i.e., the difference in phase between the output signals from the various transducers when all are driven with drive signals of the same phase. This data may be provided as separate parameters for each individual transducer in the particular array; as representative parameters for groups of transducers in the array; or as common parameters representing the properties of all of the transducers in the particular array. Also, each parameter can be provided as a single value representing performance of the transducer, group or array over its expected operating temperature range, or as data representing variation in such parameter of the transducer, group or array as a function of one or more other variables such as temperature, drive signal frequency, and instantaneous drive power. The data may be individualized data pertaining to a single disposable unit, such as data obtained from actual measurements of the performance of individual transducers included in the particular array at different temperatures. Alternatively, the data may include generic data derived for transducers of the type included in the array. Combinations of individualized data and generic data may be used. For example, the memory device 600 may contain individualized data derived from actual test or measurement of the piezoelectric transducers in the array at one temperature; such as at a nominal operating temperature, and this individualized data may be combined with generic data such as data defining the change in amplitude response versus temperature for all transducers of the same type. The use of individualized data pertaining to a particular disposable ultrasound wave unit 202 allows the control computer to compensate for differences between units and between transducers within a unit. This reduces the need for precision in manufacture of the disposable ultrasound wave units 202 to achieve identical properties in the various transducers. Although the individualized data preferably is derived from actual sonic emission testing, individualized data also can be provided by measuring, during manufacture of the disposable ultrasound wave units 202, characteristics of individual transducers or arrays which are associated with different sonic emission properties as, for example, thickness of the piezoelectric films or capacitance of the films in particular transducers at a reference temperature. This data can be converted to parameters such as those discussed above based upon relationships between the measured properties and the parameters accumulated through tests of other, similar units.

Additional details regarding the use, calibration, and testing for the memory device 600 may be found in co-pending U.S. patent application Ser. No. 09/596,678, filed Jun. 19, 2000, entitled Sonic Transducer Arrays And Methods, commonly assigned to the assignee of the present application, and the entire disclosure of which is hereby incorporated by reference.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A lens for focusing an ultrasound wave having a wavelength, comprising a plurality of substantially concentric rings disposed about a central point, at least one of the rings having a substantially triangular cross-section defined by first, second, and third sections, the first section extending from a proximal end radially away from the central point to a distal end, the second section extending from the distal end of, and substantially perpendicular to, the first section and terminating at a peak, and the third section smoothly sloping from the proximal end of the first section to the peak of the second section, wherein the lengths of first sections of respective ones of the substantially concentric rings are less than about five wavelengths of the ultrasound wave and wherein the first, second and third sections have lengths with respect to the wavelength of the ultrasound wave such that (i) phases of the ultrasound wave are substantially additive at a focal point located on an axis perpendicular to the lens that passes through the central point, and (ii) aggregate focused ultrasound energy would not be predicted at the focal point by Snell's law refraction.

2. The lens of claim 1, wherein the lens is formed substantially from polystyrene.

3. The lens of claim 1, wherein the lens is formed substantially from crystal polystyrene.

4. The lens of claim 1, wherein the third section slopes along a substantially straight trajectory from the proximal end of the first section to the peak of the second section.

5. The lens of claim 4, wherein third sections of respective substantially concentric rings have smaller lengths as the respective substantially concentric rings are radially further from the central point.

6. The lens of claim 5, wherein the slopes of the respective third sections are larger as the substantially concentric rings are radially further from the central point.

7. The lens of claim 6, wherein first sections of respective substantially concentric rings have smaller lengths as the substantially concentric rings are radially further from the central point.

8. The lens of claim 7, wherein:

the respective first sections of adjacent substantially concentric rings extend radially from the central point such that the distal end of the first section of an inner one of the adjacent substantially concentric rings terminates at the proximal end of the first section of an outer one of the adjacent substantially concentric rings; and radii, $r_i$, extending from the central point to each of the distal ends of the first sections of the substantially concentric rings, adhere to the following equation:

$$(r_i^2+F^2)^{1/2}\equiv F+\lambda_f i,$$

where i=1, 2, 3, . . . , F is a distance from a plane defined by the peaks of the substantially concentric rings to a focal point as measured along an axis normal to the plane, and $\lambda_f$ is the wavelength of the ultrasound wave in a medium outside the lens.

9. The lens of claim 1, wherein the third section slopes along a curved trajectory from the proximal end of the first section to the peak of the second section.

10. The lens of claim 9, wherein:

respective first sections of adjacent substantially concentric rings extend along a radius, r, from the central point such that the distal end of the first section of an inner one of the adjacent substantially concentric rings terminates at the proximal end of the first section of an outer one of the adjacent substantially concentric rings; and third sections of respective substantially concentric rings are curved to substantially match respective segments of the following function of r:

$$(1/\lambda_f)\cdot((r_1^2+F^2)^{1/2}-F)\cdot(1/\lambda_f-1/\lambda_{lens})^{-1},$$

where $\lambda_f$ is the wavelength of the ultrasound wave in a medium outside the lens, and F is a distance from a plane defined by the peaks of the substantially concentric rings to a focal point measured along an axis normal to the plane.

11. The lens of claim 1, wherein second sections of respective concentric rings have substantially equal lengths.

12. The lens of claim 11, wherein the lengths of the of the respective second sections are proportional to:

$$(1/\lambda_f)\cdot((r_1^2+F^2)^{1/2}-F)\cdot(1/\lambda_f-1/\lambda_{lens})^{-1},$$

where $\lambda_f$ is the wavelength of the ultrasound wave in a medium outside the lens, $\lambda_{lens}$ is the wavelength of the ultrasound wave in the lens, and $r_1$ is the radius from the center point to the distal end of the first section of one of the substantially concentric rings.

13. The lens of claim 12, wherein the lens includes a base having spaced apart first and second surfaces such that the base has a substantially uniform thickness between the first and second surfaces, and the substantially concentric rings are disposed on the first surface of the base such that the second sections of the respective substantially concentric rings extend from the first surface of the base away from the second surface of the base.

14. A lens for focusing an ultrasound wave, comprising:

a base having spaced apart first and second surfaces and a central axis extending between the first and second surfaces; and a plurality of substantially concentric rings disposed about the central axis and defining respective contours of the first and second surfaces of the base, the substantially concentric rings being sized and shaped such that, in cross-section, a plurality of concentric radially extending zones are defined from the central axis toward a periphery of the base, at least some of the rings having a substantially triangular cross-section such that a thickness of the base from the first surface to the second surface substantially smoothly increases with increased radial distance from the central axis within at least a portion of a given zone, wherein the respective substantially concentric rings are sized and shaped such that (i) phases of the ultrasound wave are substantially additive at a focal point located on the central axis perpendicular to the lens, and (ii) aggregate focused ultrasound energy would not be predicted at the focal point by Snell's law refraction.

15. The lens of claim 14, wherein the rings having a substantially triangular cross-section are defined by first, second, and third sections, the first section extending from a proximal end radially away from the central axis to a distal end, the second section extending from the distal end of, and substantially perpendicular to, the first section and terminating at a peak, and the third section sloping from a point substantially at the proximal end of the first section to the peak of the second section.

16. The lens of claim 15, wherein each radially extending zone includes at most one ring from each of the first and second surfaces of the base.

17. The lens of claim 16, wherein each radially extending zone includes only one ring from one of the first and second surfaces of the base.

18. The lens of claim 17, wherein adjacent radially extending zones include rings from respective ones of the first and second surfaces of the base.

19. The lens of claim 16, wherein each radially extending zone includes one ring from each of the first and second surfaces of the base.

20. The lens of claim 19, wherein the respective contours of the first and second surfaces in each radially extending zone appear as mirror images of one another.

21. The lens of claim 15, wherein the third section slopes along a substantially straight trajectory from the proximal end of the first section to the peak of the second section.

22. The lens of claim 16, wherein third sections of respective substantially concentric rings have smaller lengths as the respective substantially concentric rings are radially further from the central axis.

23. The lens of claim 16, wherein the slopes of the respective third sections are larger as the substantially concentric rings are radially further from the central point.

24. The lens of claim 23, wherein first sections of respective substantially concentric rings have smaller lengths as the substantially concentric rings are radially further from the central axis.

25. The lens of claim 24, wherein:

the respective first sections of adjacent substantially concentric rings extend radially from the central axis such that the distal end of the first section of an inner one of the adjacent substantially concentric rings terminates at the proximal end of the first section of an outer one of the adjacent substantially concentric rings; and radii, $r_i$, extending from the central axis to each of the distal ends of the first sections of the substantially concentric rings, adhere to the following equation:

$$(r_i^2+F^2)^{1/2}=F+\lambda_f i,$$

where i=1, 2, 3, . . . , F is a distance from a plane defined by the peaks of the substantially concentric rings to a focal point as measured along the central axis of the lens, and $\lambda_f$ is the wavelength of the ultrasound wave in a medium outside the lens.

26. The lens of claim 15, wherein the lengths of the first sections of respective ones of the substantially concentric rings are less than about five wavelengths of the ultrasound wave.

27. The lens of claim 15, wherein the third section slopes along a curved trajectory from the proximal end of the first section to the peak of the second section.

28. The lens of claim 27, wherein:

respective first sections of adjacent substantially concentric rings extend along a radius, r, from the central point such that the distal end of the first section of an inner one of the adjacent substantially concentric rings terminates at the proximal end of the first section of an outer one of the adjacent substantially concentric rings; and third sections of respective substantially concentric rings are curved to substantially match respective segments of the following function of r:

$$(1/\lambda_f)\cdot((r_1^2+F^2)^{1/2}-F)\cdot(1/\lambda_f-1/\lambda_{lens})^{-1},$$

where $\lambda_f$ is the wavelength of the ultrasound wave in a medium outside the lens, and F is a distance from a plane defined by the peaks of the substantially concentric rings to a focal point measured along the central axis of the lens.

29. The lens of claim 15, wherein second sections of respective concentric rings have substantially equal lengths.

30. The lens of claim 29, wherein the lengths of the of the respective second sections are proportional to:

$$(1/\lambda_f)\cdot((r_1^2+F^2)^{1/2}-F)\cdot(1/\lambda_f-1/\lambda_{lens})^{-1},$$

where $\lambda_f$ is the wavelength of the ultrasound wave in a medium outside the lens, $\lambda_{lens}$ is the wavelength of the ultrasound wave in the lens, and r is the radius from the center point to the distal end of the first section of one of the substantially concentric rings.

31. The lens of claim 14, wherein the lens is formed substantially from polystyrene.

32. The lens of claim 14, wherein the lens is formed substantially from crystal polystyrene.

33. A lens for focusing an ultrasound wave having a frequency f and a wavelength $\lambda_m$ in a medium having an acoustic velocity $v_m$, the lens comprising a body formed from a material having acoustic velocity $v_1$ different from $v_m$, the body having an axis, front and rear surfaces transverse to the axis, and radial directions $r_i$ perpendicular to the axis, the body varying in thickness in the radial directions so as to define a plurality of rings concentric with the axis on at least one of the surfaces, each ring having an outer wall substantially parallel to the axis and a smoothly sloping active wall extending radially and axially so that the thickness of the lens varies progressively in the radial direction within each ring substantially according to the formula:

$$(f/V_m)\cdot(r_1^2+F^2)^{1/2}-F)\cdot(f/V_m-f/V_1)^{-1},$$

where F is a distance from the axis to a focal point located along the axis away from the lens.

34. A lens as claimed in claim 33, wherein all of the active surfaces are disposed on the rear surface of the lens.

35. A lens as claimed in claim 33, wherein the body is substantially planar and extends in a plane perpendicular to the axis.

36. A lens as claimed in claim 33 wherein the active surfaces are substantially conical and the thickness of the lens varies with radius according to a linear approximation of the formula.

37. A lens as claimed in claim 36 wherein the linear approximation is selected so that the thickness of the lens at the innermost and outermost edges of each active surface is equal to the thickness according to the formula.

* * * * *

UNITED STATES PATENT AND TRADEMARK OFFICE

CERTIFICATE OF CORRECTION

PATENT NO. : 6,787,974 B2
DATED : September 7, 2004
INVENTOR(S) : Todd Fjield, Edward Paul Harhen and Patrick David Lopath It is certified that error appears in the above-identified patent and that said Letters Patent is hereby corrected as shown below:

Title page,
Item [57], ABSTRACT,
Lines 1-2, "wavelength, includes" should read -- wavelength includes --.

Column 6,
Line 60, "preferably yields" should read -- perferably yield --.

Column 7,
Line 65, "Snells law" should read -- Snell's law --.

Column 8,
Line 3, "Snells law" should read -- Snell's law --.

Column 16,
Line 21, "lengths of the of the" should read -- lengths of the --.

Column 17,
Line 25, "claim 16" should read -- claim 22 --.

Column 18,
Line 16, "lengths of the of the" should read -- lengths of the --.

Signed and Sealed this

First Day of February, 2005

JON W. DUDAS
*Director of the United States Patent and Trademark Office*